US008917674B2

(12) United States Patent
Karaoguz et al.

(10) Patent No.: US 8,917,674 B2
(45) Date of Patent: Dec. 23, 2014

(54) METHOD AND SYSTEM FOR CONTENT-AWARE MAPPING/ERROR PROTECTION

(75) Inventors: Jeyhan Karaoguz, Irvine, CA (US); Hooman Honary, Newport Coast, CA (US); Nambirajan Seshadri, Irvine, CA (US); Jason Trachewsky, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 1342 days.

(21) Appl. No.: 11/492,667

(22) Filed: Jul. 25, 2006

(65) Prior Publication Data

US 2008/0025211 A1    Jan. 31, 2008

(51) Int. Cl.
*H04W 4/00* (2009.01)
(Continued)

(52) U.S. Cl.
CPC ........... *H04L 1/0017* (2013.01); *H03M 13/356* (2013.01); *H04L 65/80* (2013.01); *H04L 1/0003* (2013.01); *H04N 19/00866* (2013.01); *H04N 19/00933* (2013.01); *H04L 2001/0093* (2013.01); *H04W 80/02* (2013.01); *H04L 1/0026* (2013.01); *H03M 13/03* (2013.01); *H04L 1/0009* (2013.01); *H04W 28/04* (2013.01)
USPC ........... 370/329; 370/469; 370/341; 370/437; 370/468; 455/435.2; 455/450; 455/455; 455/509; 375/240.27; 375/240.01; 375/240.26

(58) Field of Classification Search
CPC ............... H04L 1/0003; H04L 1/0009; H04L 2001/0092; H04L 65/4092; H04L 65/601; H04L 65/80; H04L 67/04; H04L 69/14; H04L 1/0047; H04L 1/0053; H04L 1/0054; H04L 1/0059; H04L 1/0061; H04L 47/10
USPC ............. 455/435.2, 435.3, 452.2, 456.2, 450, 455/455, 509, 512, 516; 370/329, 469, 341, 370/437, 444, 468, 230–235; 375/240.27, 375/240.01, 240.26, 240.1
See application file for complete search history.

(56) References Cited

U.S. PATENT DOCUMENTS

2003/0103571 A1\* 6/2003 Meehan et al. .......... 375/240.27
2004/0253980 A1\* 12/2004 Lane .......................... 455/552.1
(Continued)

FOREIGN PATENT DOCUMENTS

CN        1362816        8/2002
WO       03049449 A2    6/2003

OTHER PUBLICATIONS

Schurgers, C., et al., "Voice Over Wireless Internet: Performance Interaction of Signal Processing Algorithms and Network Protocols," 1999 IEEE 49th Vehicular Technology Conference, vol. 3, pp. 1935-1939.

(Continued)

*Primary Examiner* — Babar Sarwar
(74) *Attorney, Agent, or Firm* — Garlick & Markison; Randy W. Lacasse

(57) ABSTRACT

Methods and systems for content-aware mapping/error protection are disclosed. Aspects of one method may include controlling a MAC layer and/or a PHY layer (PHY/MAC layer), in a wireless communication device to wirelessly communicate multimedia information based on content of the multimedia information, which may comprise video information, audio information, and/or data. The controlling of the PHY/MAC layer may comprise selecting a forward error correction code and modulation to be applied to portions of the multimedia information, and selecting one or more antenna to transmit the portions of the multimedia information. The selection criteria may be based on priority assigned to the portions of the multimedia information, and on feedback information from the receiving device and/or a receiver co-located with the device transmitting the multimedia information.

20 Claims, 7 Drawing Sheets

(51) Int. Cl.
  *H04L 1/00*    (2006.01)
  *H04N 19/67*   (2014.01)
  *H04N 19/89*   (2014.01)
  *H03M 13/35*       (2006.01)
  *H04L 29/06*       (2006.01)
  *H04W 80/02*       (2009.01)
  *H03M 13/03*       (2006.01)
  *H04W 28/04*       (2009.01)

(56) References Cited

U.S. PATENT DOCUMENTS

2006/0092963 A1* 5/2006 Bakre et al. .................. 370/437
2006/0187874 A1* 8/2006 Zaki .............................. 370/328
2006/0209884 A1* 9/2006 MacMullan et al. .......... 370/465

OTHER PUBLICATIONS

Pei Y, et al., "Multi-Layered Video Transmission Over Wireless Channels Using an Adaptive Modulation and Coding Scheme," 2001 International Conference on Image Processing, Oct. 7, 2001.
Ghandi et al., "Unequally Error Protected Data Partitioned Video with Combined Hierarchical Modulation and Channel Coding," 2006 IEEE International Conference on Toulouse, May 14, 2006.
Amine Bouabdallah et al., "Dependency-aware Unequal Erasure Protection Codes," Journal of Zhejiang University Science, Jan. 1, 2006.
Andres Albanese et al., "Priority Encoding Transmission," IEEE Transactions on Information Theory, Nov. 1, 1996.
European Search Report: EP07005956 dated Jul. 6, 2012, 9 pages.

* cited by examiner

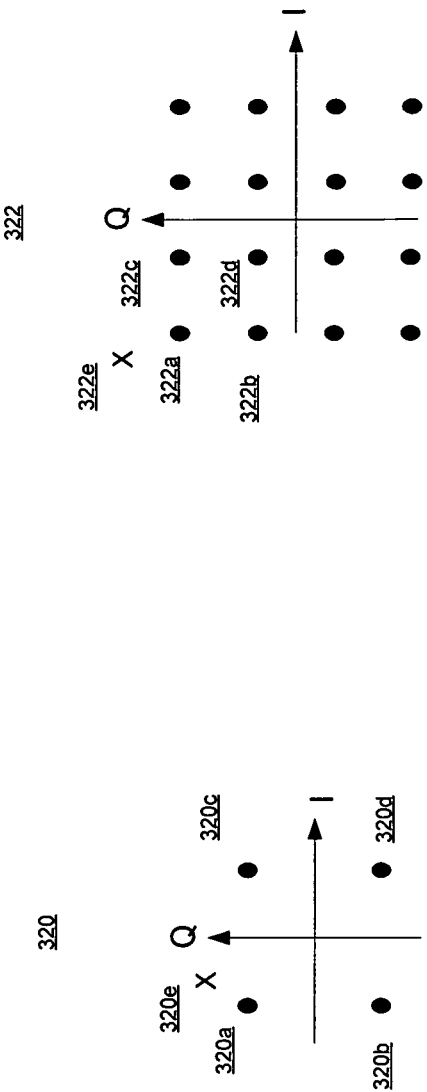

METHOD AND SYSTEM FOR CONTENT-AWARE MAPPING/ERROR PROTECTION

CROSS-REFERENCE TO RELATED APPLICATIONS/INCORPORATION BY REFERENCE

This application makes reference to:
U.S. patent application Ser. No. 11/492,391 filed on Jul. 25, 2006;
U.S. patent application Ser. No. 11/492,721 filed on Jul. 25, 2006;
U.S. patent application Ser. No. 11/492,381 filed on Jul. 25, 2006; and
U.S. patent application Ser. No. 11/492,390 filed on Jul. 25, 2006.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing data. More specifically, certain embodiments of the invention relate to a method and system for content-aware mapping/error protection.

BACKGROUND OF THE INVENTION

Broadcasting and telecommunications have historically occupied separate fields. In the past, broadcasting was largely an "over-the-air" medium while wired media carried telecommunications. That distinction no longer applies as both broadcasting and telecommunications may be delivered over either wired or wireless media. Present development may adapt broadcasting to mobility services. One limitation for transfer of multimedia data, such as, for example, for digital television, video, digital photo, voice over IP, and even pure voice, has been data transmission rate bottleneck. However, with emerging developments in high-speed wireless communications technology, even this obstacle may be overcome.

Terrestrial television and radio broadcast networks have made use of high power transmitters covering broad service areas, which enable one-way distribution of content to user equipment such as televisions and radios. By contrast, wireless telecommunications networks have made use of low power transmitters, which have covered relatively small areas known as "cells". Unlike broadcast networks, wireless networks may be adapted to provide two-way interactive services between users of user equipment such as telephones and computer equipment.

The introduction of cellular communications systems in the late 1970's and early 1980's represented a significant advance in mobile communications. The networks of this period may be commonly known as first generation, or "1G" systems. These systems were based upon analog, circuit-switching technology, the most prominent of these systems may have been the advanced mobile phone system (AMPS).

Second generation, or "2G" systems ushered improvements in performance over 1G systems and introduced digital technology to mobile communications. Exemplary 2G systems include the global system for mobile communications (GSM), digital AMPS (D-AMPS), and code division multiple access (CDMA). Many of these systems have been designed according to the paradigm of the traditional telephony architecture, often focused on circuit-switched services, voice traffic, and supported data transfer rates up to 14.4 kbits/s. Higher data rates were achieved through the deployment of "2.5G" networks, many of which were adapted to existing 2G network infrastructures. The 2.5G networks began the introduction of packet-switching technology in wireless networks. However, it is the evolution of third generation, or "3G" technology that may introduce fully packet-switched networks, which support high-speed data communications.

Standards for digital television terrestrial broadcasting (DTTB) have evolved around the world with different systems being adopted in different regions. The three leading DTTB systems are, the advanced standards technical committee (ATSC) system, the digital video broadcast terrestrial (DVB-T) system, and the integrated service digital broadcasting terrestrial (ISDB-T) system. The ATSC system has largely been adopted in North America, South America, Taiwan, and South Korea. This system adapts trellis coding and 8-level vestigial sideband (8-VSB) modulation. The DVB-T system has largely been adopted in Europe, the Middle East, Australia, as well as parts of Africa and parts of Asia. The DVB-T system adapts coded orthogonal frequency division multiplexing (COFDM). The OFDM spread spectrum technique may be utilized to distribute information over many carriers that are spaced apart at specified frequencies. The OFDM technique may also be referred to as multi-carrier or discrete multi-tone modulation. The spacing between carriers may prevent the demodulators in a radio receiver from seeing frequencies other than their corresponding frequency. This technique may result in spectral efficiency and lower multipath distortion, for example. The ISDB-T system has been adopted in Japan and adapts bandwidth segmented transmission orthogonal frequency division multiplexing (BST-OFDM). The various DTTB systems may differ in important aspects; some systems employ a 6 MHz channel separation, while others may employ 7 MHz or 8 MHz channel separations.

While 3G systems are evolving to provide integrated voice, multimedia, and data services to mobile user equipment, there may be compelling reasons for adapting DTTB systems for this purpose. One of the more notable reasons may be the high data rates that may be supported in DTTB systems. For example, DVB-T may support data rates of 15 Mbits/s in an 8 MHz channel in a wide area SFN. There are also significant challenges in deploying broadcast services to mobile user equipment. Because of form factor constraints, many handheld portable devices, for example, may require that PCB area be minimized and that services consume minimum power to extend battery life to a level that may be acceptable to users. Another consideration is the Doppler effect in moving user equipment, which may cause inter-symbol interference in received signals. Among the three major DTTB systems, ISDB-T was originally designed to support broadcast services to mobile user equipment. While DVB-T may not have been originally designed to support mobility broadcast services, a number of adaptations have been made to provide support for mobile broadcast capability. The adaptation of DVB-T to mobile broadcasting is commonly known as DVB handheld (DVB-H). The broadcasting frequencies for Europe are in UHF (bands IV/V) and in the US, the 1670-1675 MHz band that has been allocated for DVB-H operation. Additional spectrum is expected to be allocated in the L-band worldwide.

To meet requirements for mobile broadcasting the DVB-H specification may support time slicing to reduce power consumption at the user equipment, addition of a 4K mode to enable network operators to make tradeoffs between the advantages of the 2K mode and those of the 8K mode, and an additional level of forward error correction on multi-protocol encapsulated data—forward error correction (MPE-FEC) to make DVB-H transmissions more robust to the challenges presented by mobile reception of signals and to potential limitations in antenna designs for handheld user equipment. DVB-H may also use the DVB-T modulation schemes, like QPSK and 16-quadrature amplitude modulation (16-QAM), which may be more resilient to transmission errors. MPEG audio and video services may be more resilient to error than data, thus additional forward error correction may not be required to meet DTTB service objectives.

However, the environment for a mobile user equipment, or a mobile terminal, may change as the mobile terminal moves. A signal from a transmitter to the mobile terminal may change in strength as the mobile terminal moves with respect to the transmitter. The signal from the mobile terminal may also take different paths by, for example, reflecting from buildings, trees, bodies of water, the ground, and/or other surfaces. The transmitted signal may also be attenuated when it passes through an object, for example, various glass surfaces in buildings. The changes in signal strength and integrity may need to be taken in to account to optimize data throughput.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for content-aware mapping/error protection, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 3c illustrates an exemplary constellation with four constellation points, which may be utilized in connection with an embodiment of the invention.

FIG. 3d illustrates an exemplary constellation with 16 constellation points, which may be utilized in connection with an embodiment of the invention.

DETAILED DESCRIPTION OF THE INVENTION

Certain embodiments of the invention may be found in a method and system for content-aware mapping/error protection. Aspects of the method may comprise controlling a MAC layer and/or a PHY layer, in a wireless communication device to wirelessly communicate multimedia information based on content of the multimedia information, which may comprise video information, audio information, and/or data.

A priority for each portion of the multimedia information may be determined, and the priority may be used to control operation on each portion of the multimedia information before transmitting the multimedia information. The priority may be used to select, for example, a forward error correction (FEC) code that may be applied to a portion of the multimedia information. The priority may also be used to select a RF modulation scheme to apply to a portion of the multimedia information and/or at least one antenna from which to transmit the portion of the multimedia information.

Feedback information may also be processed and used to control operation on each portion of the multimedia information before transmitting the multimedia information. The feedback information may be from, for example, a mobile terminal that receives transmission of the multimedia information, or from a receiver that is co-located with the transmitter that transmits the multimedia information. The feedback information may be used to select a FEC code that may be applied to a portion of the multimedia information. The feedback information may also be used to select a RF modulation scheme to apply to a portion of the multimedia information. The feedback information may also be used to select at least one antenna from which to transmit the portion of the multimedia information.

Figure 1:
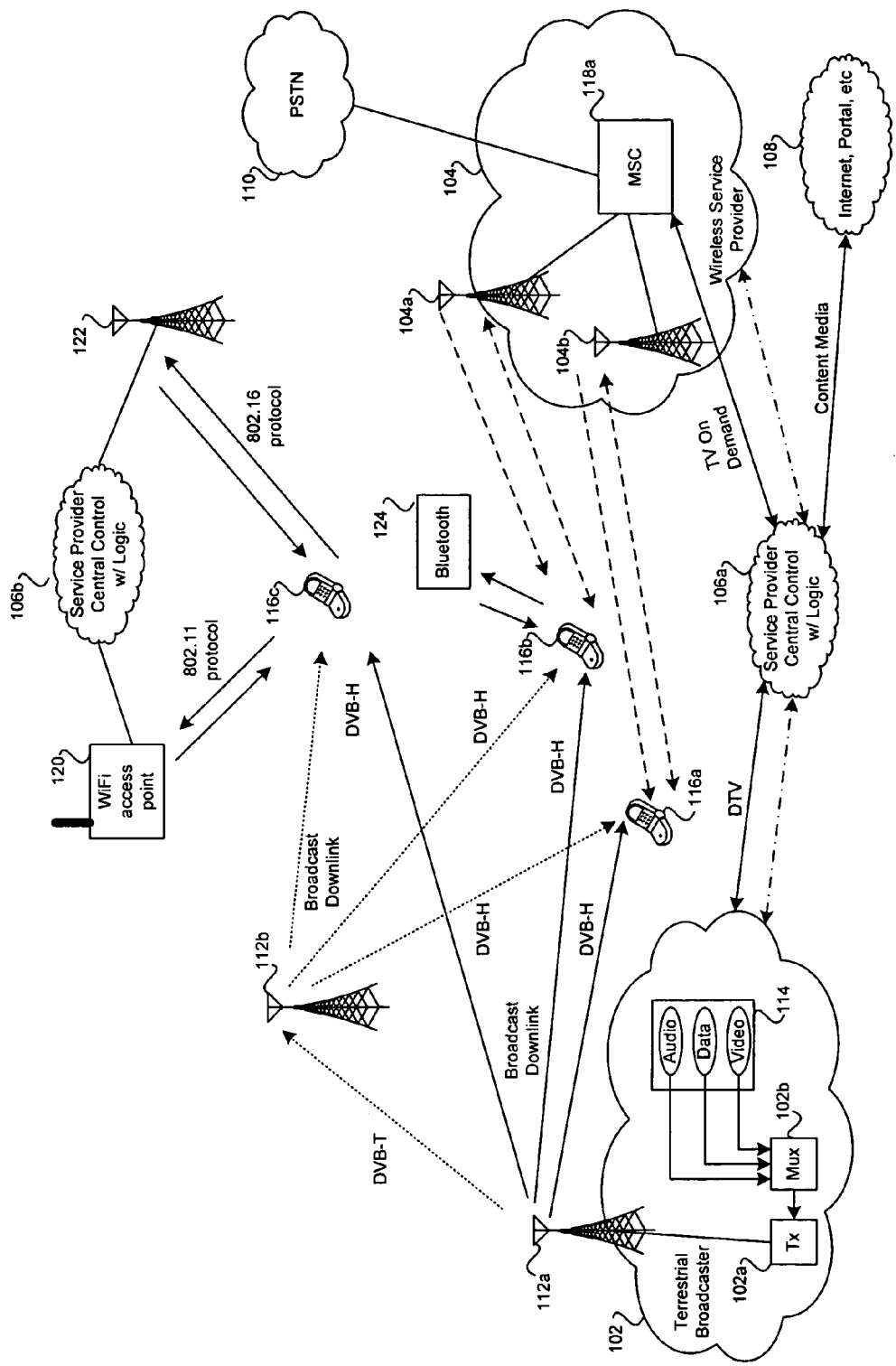
FIG. 1 is a block diagram illustrating an exemplary system that may be utilized for content-aware mapping and error protection, in accordance with an embodiment of the invention.

FIG. 1 is a block diagram illustrating an exemplary system that may be utilized for content-aware mapping and error protection, in accordance with an embodiment of the invention. Referring to FIG. 1, there is shown terrestrial network 102, wireless service provider network 104, service provider 106a and 106b, portal 108, public switched telephone network (PSTN) 110, mobile terminals 116a, 116b, and 116c, a WiFi access point 120, a WiMax transmitter 122, and a Bluetooth device 124. The terrestrial network 102 may comprise transmitter (Tx) 102a, multiplexer (Mux) 102b, and information content source 114. The content source 114 may also be referred to as a data carousel, which may comprise audio, data and video content. The terrestrial network 102 may also comprise DVB antennas 112a and 112b that may be adapted to transmit DVB-based information, such as DVB-T or DVB-H, to the mobile terminals 116a, 166b, and 116c. In this regard, the DVB antennas 112a and 112b may communicate with each other via DVB-T and with the mobile terminals via DVB-H, for example. The wireless service provider network 104 may comprise mobile switching center (MSC) 118a, and a plurality of cellular base stations 104a and 104b.

The WiFi access point 120 may allow a terminal, such as, for example, the mobile terminal 116a, 116b, or 116c, to access a network such as, for example, the Internet. Additionally, the WiMax antenna 122 may also allow a terminal, such as, for example, the mobile terminal 116a, 116b, or 116c, to access a network such as, for example, the Internet. The WiFi access point 120 and the WiMax antenna 122 may be serviced by, for example, the service provider 106b. The mobile terminal 116a, 116b, and 116c may also allow communication using Bluetooth protocol. For example, the mobile terminal 116b may communicate with the Bluetooth device 124, which may be, for example, a wireless headset for a cellular phone. The network described in FIG. 1 need not be limited to any specific technology and, accordingly, may also support other communication technologies such as wireless metropolitan area networks (WMAN), wireless local area networks (WLAN), and/or wireless personal area networks (WPAN), for example. Accordingly, the mobile terminals may possess the capability to handle any one or more of a plurality of exemplary access technologies such as DVB-H, WCDMA, CDMA, CDMA200, GSM, 802.11, 802.16 and Bluetooth.

The terrestrial network 102 may comprise suitable equipment that may enable encoding and/or encryption of data for transmission via the transmitter 102a. The transmitter 102a in the terrestrial network 102 may enable utilizing, for example, DVB channels to communicate information to the mobile terminals. In this regard, the transmitter 102a may enable DVB-H transmission to the mobile terminals via the ultra high frequency (UHF) band, such as bands IV/V, the 1670-1675 MHz band, and/or the L-band, for example. The transmitter 102a may have the capability to determine the type of media that is being communicated and accordingly alter the type of modulation and/or coding used to process the media content so as to provide content-aware mapping and error protection.

Multiple-input-multiple-output (MIMO) communication utilizing multiple antennas in the transmitter 102a, the mobile terminals 116a, 116b, and/or 116c may provide feedback information regarding metrics associated with the transmission performance between the terminals and the transmitter, so as to provide optimized content-aware mapping and error protection. U.S. application Ser. No. 11/492,391 filed on Jul. 25, 2006, provides an exemplary communication system that utilizes content-aware multiple input multiple output (MIMO) encoding and is hereby incorporated herein by reference in its entirety. The transmitter 102a may also utilize, for example, beamforming to transmit information. The beamforming may also utilize the feedback information provided by the mobile terminals 116a, 116b, and/or 116c. U.S. application Ser. No. 11/492,721 filed on Jul. 25, 2006, provides an exemplary communication system that utilizes content-aware beamforming encoding and is hereby incorporated herein by reference in its entirety.

The multiplexer 102b associated with the terrestrial network 102 may be utilized to multiplex data from a plurality of sources. For example, the multiplexer 102b may be adapted to multiplex various types of information such as audio, video and/or data into a single pipe for transmission by the transmitter 102a. Content media from the portal 108, which may be handled by the service provider 106a may also be multiplexed by the multiplexer 102b. The portal 108 may be an ISP service provider. The mobile terminals 116a, 116b, and/or 116c may receive DVB-H services from the DVB antennas 112a or 112b whenever the mobile terminals are within operating range of the DVB antenna.

In one aspect of the invention, the terrestrial network 102 may enable providing one or more digital television (DTV) channels to the service provider 106a. In this regard, the terrestrial network 102 may comprise suitable high-speed or broadband interfaces that may be utilized to facilitate transfer of the DTV channels from the terrestrial network 102 to the service provider. The service provider 106a may then utilize at least a portion of the DTV channels to provide television (TV) on demand service, or other similar types of services to the wireless service provider network 104. Accordingly, the service provider 106a may further comprise suitable high-speed or broadband interfaces that may be utilized to facilitate the transfer of related TV on demand information to the MSC 118a. The communication links between the terrestrial network 102 and the service provider 106a and the communication links between the service provider 106a and the wireless service provider 104 may be wired and/or wireless communication links.

The wireless service provider network 104 may be a cellular or personal communication service (PCS) provider that may enable broadcasting UMTS (B-UMTS), for example. The term cellular as utilized herein refers to both cellular and PCS frequencies bands. Hence, usage of the term cellular may comprise any band of frequencies that may be utilized for cellular communication and/or any band of frequencies that may be utilized for PCS communication. Notwithstanding, broadcast UMTS (B-UMTS) may also be referred to as MBMS. MBMS is a high-speed data service that is overlaid on WCDMA to provide much higher data rates than may be provided by core WCDMA. In this regard, the B-UMTS services may be superimposed on the cellular or PCS network.

The wireless service provider network 104 may utilize cellular or PCS access technologies such as GSM, CDMA, CDMA2000, WCDMA, AMPS, N-AMPS, and/or TDMA, for example. The cellular network may be utilized to offer bi-directional services via uplink and downlink communication channels, while the B-UMTS or MBMS network may be utilized to provide a unidirectional broadband services via a downlink channel. In accordance with an embodiment of the invention, content-aware coding, mapping, and/or error protection may be utilized on the downlink. The B-UMTS or MBMS unidirectional downlink channel may be utilized to transmit content media and/or multimedia type information to the mobile terminals 116a and 116b. Although MBMS provides only unidirectional downlink communication, other bidirectional communication methodologies comprising uplink and downlink capabilities, whether symmetric or asymmetric, may be utilized.

The wireless service provider network 104 need not be limited to a GSM, CDMA, WCDMA based network and/or variants thereof. In this regard, the wireless service provider network 104 may be, for example, an 802.11, an 802.16, or a wireless local area network (WLAN). The wireless service provider network 104 may also be adapted to provide 802.11 or 802.16 based wireless communication in addition to GSM, CDMA, WCDMA, CDMA2000 based network and/or variants thereof. For example, the mobile terminals 116a, 116b, and 116c may access a network via a WiFi access point 120 and/or the WiMax antenna 122. In this case, the mobile terminals 116a, 116b, and 116c may also be compliant with the 802.11-based wireless network.

The service provider 106a may comprise suitable interfaces, circuitry, logic and/or code that may enable communication between the terrestrial network 102 and the wireless communication network 104. The service provider 106a may enable its interfaces to facilitate exchange control information with the terrestrial network 102 and to exchange control information with the wireless service provider 104. The control information exchanged by the service provider 106a with the terrestrial network 102 and the wireless communication network 104 may be utilized to control certain operations of the mobile terminals, the terrestrial network 102 and the wireless communication network 104.

The portal 108 may comprise suitable logic, circuitry and/or code that may enable providing content media to the service provider 106a via one or more communication links. These communication links, although not shown, may comprise wired and/or wireless communication links. In various exemplary embodiments of the invention, these communication links may utilize any of a plurality of communication access technologies disclosed herein. Other access technologies not disclosed herein may be utilized without departing from the spirit or scope of the invention. The content media that may be provided by the portal 108 may comprise audio, data, video or any combination thereof. In this regard, the portal 108 may provide one or more specialized information services to the service provider 106a.

The public switched telephone network (PSTN) 110 may be coupled to the MSC 118a. Accordingly, the MSC 118a may enable switching of calls originating from within the PSTN 110 to one or more mobile terminals serviced by the wireless service provider 104. Similarly, the MSC 118a may enable switching of calls originating from mobile terminals serviced by the wireless service provider 104 to one or more telephones serviced by the PSTN 110.

The information content source 114 may comprise a data carousel. In this regard, the information content source 114 may provide various information services, which may comprise online data including audio, video and data content. The information content source 114 may also comprise file download, and software download capabilities. In instances where a mobile terminal fails to acquire requested information from the information content source 114 or the requested information is unavailable, then the mobile terminal may acquire the requested information via, for example, B-UMTS from the portal 108. The request may be initiated through an uplink cellular communication path.

The mobile terminals 116a, 116b, and 116c may comprise suitable logic, circuitry and/or code that may enable handling the processing of uplink and downlink cellular channels for various access technologies and DVB-H technologies. The mobile terminals 116a, 116b, and 116c may enable processing of voice, video, and data services, for example. In an exemplary embodiment of the invention, the mobile terminals 116a, 116b, and 116c may enable utilizing one or more cellular access technologies such as GSM, GPRS, EDGE, CDMA, WCDMA, CDMA2000, HSDPA and MBMS (B-UMTS). The mobile terminal may also enable receiving and processing DVB-H signals in the DVB-H bands. A mobile terminal may also enable requesting information via a first cellular service and in response, receive corresponding information via a DVB-H service. A mobile terminal may also enable requesting of information from a service provider via a cellular service and in response, receive corresponding information via a data service, which is provided via the cellular service. The mobile terminals may also be adapted to receive DVB-H information from the base stations 104a or 104b or from the DVB-H antennas 112a and 112b. In instances where a mobile terminal receives information from any of the base stations 104a or 104b via a downlink MBMS communication channel, then the mobile terminal may communicate corresponding uplink information via an uplink cellular communication channel.

Transmission of data that requires wide bandwidth, for example, video data, may need to be optimized as to the amount of data transmitted. Accordingly, data may be compressed prior to transmission to reduce the amount of data that needs to be transmitted. The compression may take place, for example, in the transmitter 102a. Since errors in the compressed data may lead to inability to decompress the data or to give a result that may affect the decompressed data adversely, data protection methods may be used to enable correction of detected errors. Data protection methods may differ in the number of extra bits that may be used for error detection and correction. Generally, the more bits that are used, the more the data may be protected from uncorrectable errors. However, the extra bits may also reduce the throughput of the data.

Accordingly, different portions of the multimedia information, such as video, audio, or data content, may be given different priority, where the priority may be used to determine the data protection method used to protect the data. Additionally, if MIMO transmission and/or beamforming with a plurality of antennas is used, feedback information, such as performance metrics, from the mobile terminals 116a, 116b, and 116c that may be utilized to determine which antenna may transmit content with certain priorities.

For example, if antennas 112a and 112b are used for MIMO transmission, feedback information from the mobile terminals may be utilized to determine that high priority data, such as video content, for example, may be transmitted from the antenna 112a and low priority data, such as audio content, for example, may be transmitted from the antenna 112b. Even in cases where feedback information may not be available from the receiving mobile terminal, content-aware mapping/error protection, antenna selection, and/or encoding methods may be utilized. In this regard, channel estimations may be utilized for determining the appropriate content-aware mapping/error protection, antenna selection, and/or encoding method, for example.

Figure 2A:
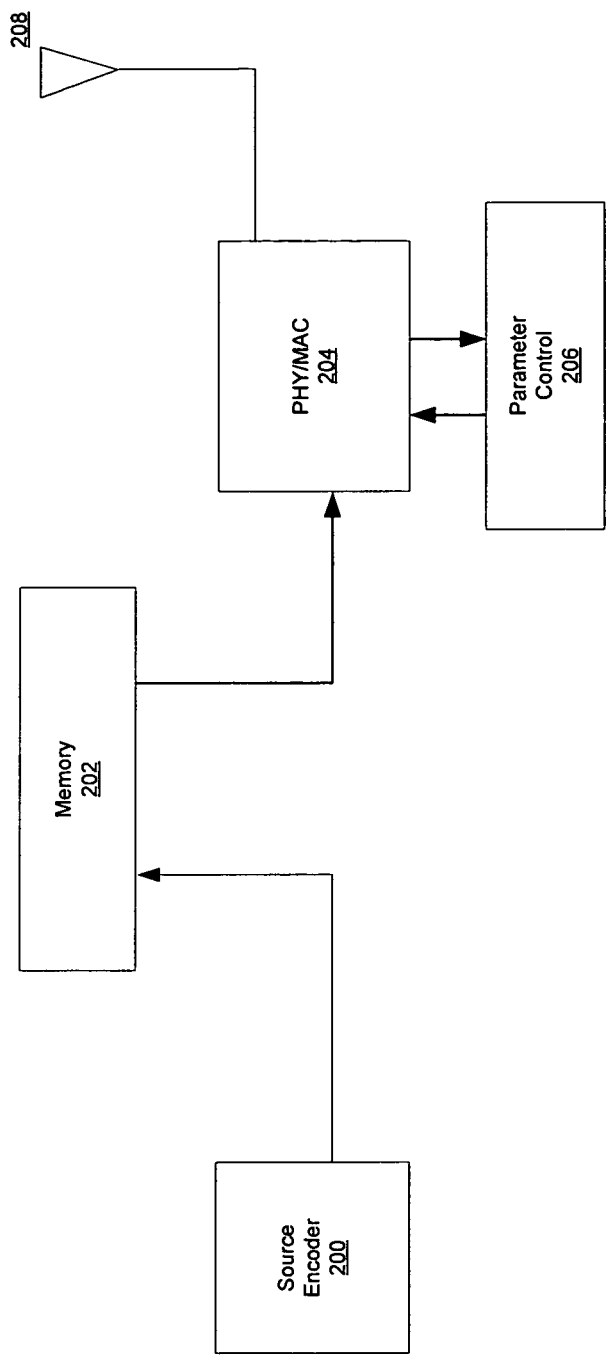
FIG. 2a illustrates an exemplary conventional architecture for transmitting data.

FIG. 2a illustrates an exemplary conventional architecture for transmitting data. Referring to FIG. 2a, there is shown a source encoder block 200, a memory block 202, a physical layer/media access control layer (PHY/MAC) block 204, a parameter control block 206, and a transmit antenna 208. The source encoder block 200 may comprise suitable logic, circuitry, and/or code that may be utilized to enable, compression of data that is to be transmitted. For example, the compressed data may be video data in MPEG-4 format.

The PHY/MAC block 204 may comprise suitable logic, circuitry, and/or code that may be utilized to enable conversion of input data in a digital format to output suitably modulated radio frequency (RF) signal. For example, the PHY/MAC block 204 may apply a forward error correction (FEC) code to the digital data. The PHY/MAC block 204 may also convert the digital data to an analog signal, and then RF modulate the analog signal. The PHY/MAC block 204 may communicate the modulated analog signal to the transmit antenna 208 for transmission.

The parameter control block 206 may comprise suitable logic, circuitry, and/or code that may be utilized to enable controlling of various operations on the digital data in the PHY/MAC block 204 before the digital data is output for transmission. For example, the parameter control block 206 may configure the PHY/MAC block 204 to use a specific FEC code and/or RF modulation.

In operation, the source encoder 200 may, for example, compress video data to MPEG-4 format and store the compressed data in the memory block 202. The PHY/MAC 204 may read portions of the compressed data from the memory block 202. The PHY/MAC 204 may then perform various operations to generate a suitable RF signal that may be transmitted via the transmit antenna 208 to mobile terminals, for example, the mobile terminals 116a, 116b, and 116c.

Figure 2B:
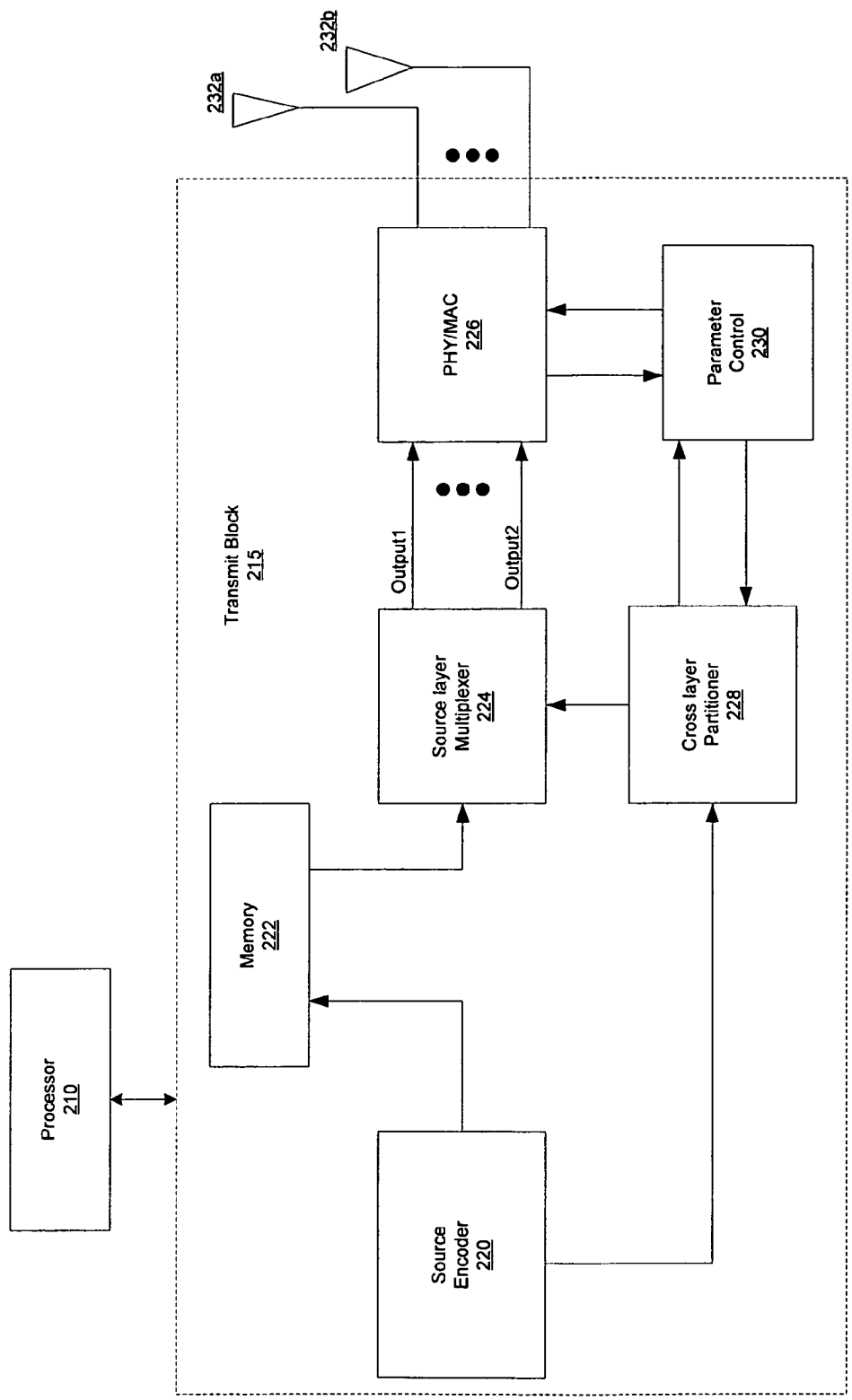
FIG. 2b illustrates an exemplary architecture for source layer optimization for transmitting data, in accordance with an embodiment of the invention.

FIG. 2b illustrates an exemplary architecture for source layer optimization for transmitting data, in accordance with an embodiment of the invention. Referring to FIG. 2b, there is shown a processor 210 and a transmit block 215. The transmit block 215 may comprise a source encoder block 220, a memory block 222, a source layer multiplexer block 224, a PHY/MAC block 226, a cross-layer partitioner block 228, a parameter control block 230, and transmit antennas 232a, . . . , 232b. The transmit block 215 may be, for example, part of the cellular base stations 104a or 104b.

The source encoder block 220 may comprise suitable logic, circuitry, and/or code that may be utilized to enable compression of data prior to transmission. For example, the compressed data may be video data in MPEG-4 format. The source encoder block 220 may also communicate information about the compressed data to the cross-layer partitioner block 228. The information communicated may relate to the type of compression. For example, if the compressed data comprises video data, the source encoder block 220 may communicate the specific type of compression, such as MPEG-1, MPEG-2, MPEG-4, H.261, H.263, or H.264. The source encoder block 220 may also communicate the type of chroma subsampling used, such as, for example, 4-4-4, 4-2-2, or 4-2-0 chroma subsampling.

The source layer multiplexer block 224 may comprise suitable logic, circuitry, and/or code that may be utilized to enable reading data from, for example, the memory block 222 and communicating various portions of the data to the PHY/MAC 226. The data may be split in to the various portions according to information from the cross-layer partitioner block 228. The information from the cross-layer partitioner block 228 may comprise, for example, priority for the various portions of the data. The priority may be based on, for example, perceived importance of the information in the memory block 222. The number of priorities may be design and/or implementation dependent. The cross-layer partitioner block 228 may also indicate that portions of data with certain priority may be communicated via certain outputs of the source layer multiplexer block 224.

The PHY/MAC block 226 may comprise suitable logic, circuitry, and/or code that may be utilized to enable conversion of input data in a digital format to output suitably modulated analog data ready for transmission. For example, the PHY/MAC block 226 may apply a FEC code to the digital data. The PHY/MAC block 226 may also apply a specific RF modulation to the analog signal, which may have been converted from the digital data. The PHY/MAC block 226 may additionally communicate analog signals to different transmit antennas 232a, . . . , 232b, in a part of a multiple-antenna architecture. Accordingly, the transmission from the transmit antennas 232a, . . . , 232b may be a MIMO transmission and/or beamformed transmission.

In an embodiment of the invention, the PHY/MAC block 226 may receive one or more streams of digital data. The PHY/MAC block 226 may then operate on the multiple streams as indicated by, for example, the parameter control block 230. Accordingly, the PHY/MAC block 226 may, for example, apply a specific FEC code to each digital stream. Each digital stream may then be converted to analog RF signal, which may be modulated by a specific RF modulation scheme. Each modulated RF signal may then be communicated to one or more antennas to be transmitted.

The cross-layer partitioner block 228 may comprise suitable logic, circuitry, and/or code that may be utilized to enable assigning a priority to portions of data in the memory block 222. The priority may be based on, for example, perceived importance of the information in the memory block 222. For example, if the data in the memory block 222 comprises video data relating to video frames, a portion of the data that comprises information about an entire frame, such as, example, an I-frame, may have a high priority. Other frames, such as, for example, P-frames may have a lower priority than I-frames since P-frames may depend on the I-frames for additional information. P-frames that depend on other primary P-frames may be, for example, assigned a lower priority than the P-frames that may only depend on I-frames. A B-frame that depends on a prior and subsequent frame may be assigned, for example, a lowest priority. The number of priorities may be design and/or implementation dependent.

The cross-layer partitioner block 228 may also indicate to the source layer multiplexer block 224 that data with certain priorities may be communicated to the PHY/MAC block 226 via specific outputs of the source layer multiplexer block 224. The cross-layer partitioner block 228 may then communicate to the parameter control block 230 those operations that may be performed on the various streams of data communicated by the source layer multiplexer 224.

Specific streams of data may be communicated to specific transmit antennas. The cross-layer partitioner block 228 may have information regarding the propagation path from each transmit antenna 232a, . . . , 232b to a receive antenna, where data transmitted via one transmit antenna may be received with fewer bit errors, for example, than data transmitted by another transmit antenna. Accordingly, this information may be used to determine which data may be transmitted via which transmit antenna. The information regarding the propagation path for each transmit antenna may be generated, for example, from feedback information from the receiving devices. Alternatively, the information may be generated from feedback information from a receiver co-located with the transmit block 215.

The parameter control block 230 may comprise suitable logic, circuitry, and/or code that may be utilized to enable controlling of various operations to the digital data in the PHY/MAC block 226. For example, the parameter control block 230 may determine the FEC code and/or the RF modulation that may be used by the PHY/MAC block 226 for specific portions of data. The parameter control block 230 may also determine which antennas may be used to transmit which portions of data by controlling routing of the data within the PHY/MAC block 226 to the specific antennas.

However, there may be other embodiments of the invention that route signals to specific antennas using other methods. For example, some embodiments of the invention may select the antenna used to transmit data by selecting the source layer multiplexer 224 output used to communicate data from the source layer multiplexer 224 to the PHY/MAC 226. Data communicated to the PHY/MAC 226 via specific outputs to the PHY/MAC 226 may be transmitted via specific transmit antennas. For example, the data, Output1, may be transmitted by the transmit antenna 232a, and the data, Output2, may be transmitted by the transmit antenna 232b.

In operation, the source encoder block 220 may compress data and store the compressed data in the memory block 222. For simplicity, the data may be assumed to be video data compressed using the MPEG-4 format, two priority levels may be used—a high priority level and a low priority level, and Output1 data and Output2 data may be transmitted by the transmit antennas 232a and 232b, respectively. The source encoder block 220 may communicate to the cross layer partitioner block 228 that the compressed data is video data using the MPEG-4 format. The source encoder block 220 may also communicate, for example, start and end memory addresses for the stored video data corresponding to a frame, the frame number, and the type of frame that may be stored. The type of frame may be, for example, I-frame, P-frame, and B-frame.

Other information may also be communicated, such as, for example, the chroma sub-sampling format.

The cross layer partitioner block 228 may then determine a priority to assign to each frame. An exemplary priority level algorithm may assign a high priority for all I-frames and a low priority for all other frames. The priority for the video data in the memory block 222 may be communicated to the source layer multiplexer block 224. The source layer multiplexer 224 may read data from the memory block 222, and may output, for example, high priority data as Output1 and the low priority data as Output2.

The cross layer partitioner block 228 may also communicate to the parameter control block 230 the operations to be applied to each stream of data, namely, Output1 and Output2. For example, the parameter control block 230 may indicate that the high priority data Output1 may have applied to it a forward error correction (FEC) code A that may have a greater overhead in the number of bits used than a FEC code B. However, using the FEC code A may allow a receiving unit, for example, the mobile terminal 116a, to correct a larger number of faulty bits than when using the FEC code B.

The cross layer partitioner block 228 may also communicate to the parameter control block 230 to use, for example, quadrature phase shift keying (QPSK) RF modulation rather than 16 quadra amplitude modulation (16 QAM) RF modulation for the high priority data Output1. The QPSK RF modulation may have a smaller data throughput than the 16 QAM RF modulation, however, the QPSK RF modulation may be more reliable for a given transmission environment.

Other exemplary modulation types may comprise binary phase shift keying (BPSK), 64 level QAM (64 QAM), and 256 level QAM (256 QAM). For the BPSK modulation type, the number of coded bits associated with a symbol may be represented: $b_{sym}[f_k]=1$, for each frequency carrier $f_k$. For the QPSK modulation type, the number of coded bits associated with a symbol may be represented: $b_{sym}[f_k]=2$, for each frequency carrier $f_k$. For the 16 QAM modulation type, the number of coded bits associated with a symbol may be represented: $b_{sym}[f_k]=4$, for each frequency carrier $f_k$. For the 64 QAM modulation type, the number of coded bits associated with a symbol may be represented: $b_{sym}[f_k]=6$, for each frequency carrier $f_k$. For the 256 QAM modulation type, the number of coded bits associated with a symbol may be represented: $b_{sym}[f_k]=8$, for each frequency carrier $f_k$.

The spatial stream of transmitted symbols may comprise a plurality of frequency carriers, $N_{SD}$, for example a 20 MHz RF channel may comprise $N_{SD}=56$ frequency carriers, $f_{-28}$, $f_{-27}, \ldots, f_{-1}, f_1, \ldots, f_{27}$, and $f_{28}$, that may be utilized for transmitting coded bits, while a 40 MHz RF channel may comprise $N_{SD}=112$ frequency carriers, $f_{-56}, f_{-55}, \ldots, f_{-1}$, $f_1, \ldots, f_{55}$, and $f_{56}$, that may be utilized for transmitting coded bits. In a MIMO system, the symbols $sym[f_{-28}]$, $sym[f_{-27}], \ldots, sym[f_{-1}], sym[f_1], \ldots, sym[f_{27}]$, and $sym[f_{28}]$, or $sym[f_{-56}], sym[f_{-55}], \ldots, sym[f_{-1}], sym[f_1], \ldots, sym[f_{55}]$, and $sym[f_{56}]$, may be collectively referred to as an orthogonal frequency division multiplexing (OFDM) symbol. The number of coded bits associated with an OFDM symbol, $N_{CBPS}=N_{SD}*b_{sym}[f_k]$. The number of data bits associated with the OFDM symbol, $N_{DBPS}=R*N_{SD}*b_{sym}[f_k]$, where R may refer to the coding rate.

A spatial stream may comprise transmission from, for example, a one or more transmit antennas. For example, a plurality of antennas may transmit a spatial stream of data using MIMO technology and/or beamforming technology. Alternatively, one antenna may transmit a spatial stream of data. For example, the transmit antenna 232a may exhibit more reliable transmission characteristics than the transmit antenna 232b. If the transmission environment changes such that the transmit antenna 232b exhibits a more reliable transmission characteristics than the transmit antenna 232a, then the cross layer partitioner block 228 may indicate that the higher priority data be output as Output2.

The cross layer partitioner block 228 may also take in to account feedback information from the receiving device, for example, the mobile terminal 116a, to maximize throughput for transmission of the high priority and low priority data. This may allow, for example, the cross layer partitioner block 228 to select from a plurality of FEC codes and from a plurality of RF modulation schemes for a plurality of priority levels. Similarly, MIMO and/or beamforming transmission may allow choosing a transmission method where a plurality of antennas may be selected for transmission of particular stream of data.

Various transmission methods are discussed in U.S. application Ser. No. 11/492,391, filed on Jul. 25, 2006, and the U.S. application Ser. No. 11/492,721, filed on Jul. 25, 2006, each of which is hereby incorporated herein by reference in its entirety.

Although feedback information from a receiving device may be used for transmission, the invention need not be so limited. For example, feedback data from a receiver that is co-located with the transmitting device may also be used. Accordingly, for example, the processor 210 may communicate the feedback data and/or instructions to the transmit block 215. For example, the processor 210 may process the feedback data from a co-located receiving device, and communicate information to the transmit block 215. The information may be used, for example, to control the operations on the data streams by the PHY/MAC block 226.

Although an embodiment of the invention may have been described using a plurality of functional blocks, the invention need not be so limited. Accordingly, other embodiments of the invention may use different blocks that may encompass various functionalities.

Figure 3A:
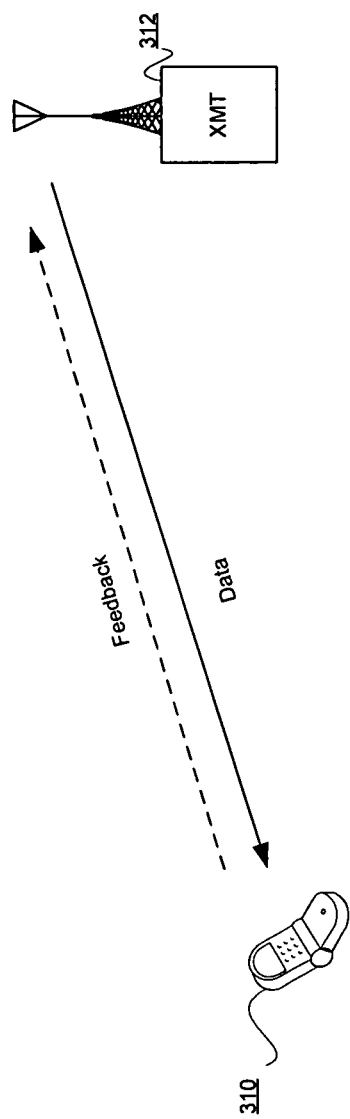
FIG. 3a illustrates an exemplary feedback from a receiver to a transmitter, in accordance with an embodiment of the invention.

FIG. 3a illustrates an exemplary feedback from a receiver to a transmitter, in accordance with an embodiment of the invention. Referring to FIG. 3a, there is shown a mobile terminal 310 and a transmitting terminal 312. The transmitting terminal 312 may transmit, for example, video data as described with respect to FIG. 2b, and the mobile terminal 310 may receive the transmitted video data. The mobile terminal 310 may process the received video data and generate metrics that may indicate, for example, bit error rate and/or signal-to-noise ratio (SNR) for a particular propagation path. The propagation path may be, for example, a specific path taken by a transmitted signal from one or more transmit antennas to the mobile terminal. Alternatively, the propagation path may be a combined path where the same data may have been transmitted via a plurality of MIMO transmit antennas.

The mobile terminal 310 may feed back the received-signal metrics to the transmitting terminal 312. The transmitting terminal 312 may then use the metrics to determine what specific operations may need to be performed by, for example, the PHY/MAC block 226. Although an embodiment of the invention may have been described with respect to the transmitting terminal 312, the invention need not be so limited. For example, the mobile terminal 310 may also use an embodiment of the invention in order to optimize throughput during transmission.

Figure 3B:
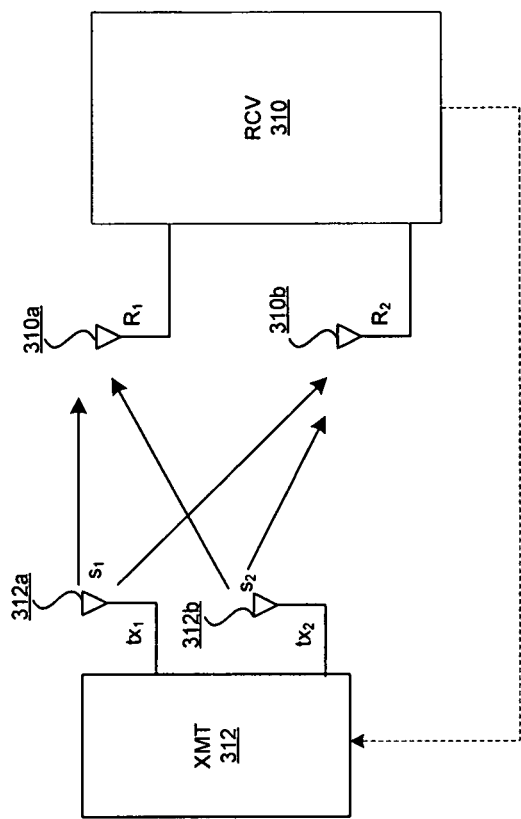
FIG. 3b illustrates an exemplary multiple antenna architecture with feedback from a receiver to a transmitter, in accordance with an embodiment of the invention.

FIG. 3b illustrates an exemplary multiple antenna architecture with feedback from a receiver to a transmitter, in accordance with an embodiment of the invention. Referring to FIG. 3b, there is shown the transmitting terminal 312 and the mobile terminal 310, which may receive the data transmitted by the transmitting terminal 312. The transmitting terminal 312 may transmit signals via the transmit antennas 312a and 312b, and the mobile terminal may receive signals via the antennas 310a and 310b. The transmitting terminal 312 may generate the RF signals $tx_1$ and $tx_2$, which may be transmitted via the transmit antennas 312a and 312b, respectively. The transmitted RF signals may be represented by s1 and s2. The signals received by the receive antennas 310a and 310b may be represented by R1 and R2, respectively.

In operation, a receive antenna, for example, the receive antenna 310a, may receive signals from a plurality of transmit antennas, for example, the transmit antennas 312a and 312b. In some instances, the transmit antennas 312a and 312b may transmit the same data. In other instances, the transmit antennas 312a and 312b may transmit different data. The mobile terminal 310 may process the received signals R1 and R2 to estimate what information may have been transmitted by the transmitting terminal 312. The mobile terminal 310 may also generate various signal metrics such as, for example, the SNR and bit error rate. The signal metrics may be fed back to the transmitting terminal 312.

For example, the transmitting terminal 312 may transmit different data via the transmit antennas 312a and 312b. The mobile terminal 310 may also process the received signal R1 for the data transmitted by the transmit antenna 312a, and the received signal R2 for the data transmitted by the transmit antenna 312b. Accordingly, if the bit error rate for the received signal R1 is less than the bit error rate for the received signal R2, this information may be fed back to the transmitting station 312. The transmitting station 312 may then assign, for example, the transmit antenna R1 for the high priority data and the transmit antenna R2 for the low priority data. Similarly, the bit error rate and other metrics fed back to the transmitting terminal 312 may be used by the transmitting terminal 312 to select, for example, different FEC codes and/or RF modulation schemes.

FIG. 3c illustrates an exemplary constellation with four constellation points, which may be utilized in connection with an embodiment of the invention. Referring to FIG. 3c, there is shown a constellation 320 with four constellation points 320a, 320b, 320c, and 320d, and a symbol 320e. QPSK modulated RF signals may be received by the mobile terminal 310 and may be demodulated and processed to generate a baseband signal. The resulting signals may be mapped to one of the four constellation points.

In one aspect of the invention, each symbol of a demodulated signal may be mapped directly to one of the four constellation points. However, because of noise in the propagation path, and interference from other RF sources, among other factors, a symbol may not be able to be mapped directly to a constellation point. For example, the symbol 320e may need to be mapped. Accordingly, the mobile terminal 310 may try to map the symbol 320e to, for example, the constellation point closest to the symbol. Since the symbol 320e is the closest to the constellation point 320a, the symbol 320e may be mapped to the constellation point 320a.

With respect to FIG. 3c, since there may only be four possibilities for mapping, the likelihood of error may be less than if there were more than four constellation points. For example, 16 QAM modulation as illustrated with respect to FIG. 3d may comprise 16 constellation points. Accordingly, for a given propagation path, data transmitted using the QPSK modulation may allow fewer errors than, for example, data transmitted using the 16 QAM modulation.

FIG. 3d illustrates an exemplary constellation with 16 constellation points, which may be utilized in connection with an embodiment of the invention. Referring to FIG. 3d, there is shown a constellation 322 with 16 constellation points and a symbol 322e. Four of these 16 constellation points are labeled 322a, 322b, 322c, and 322d. The mobile terminal 310 may receive 16 QAM modulated RF signals. The RF signal may be demodulated and processed to generate a baseband signal. The resulting symbols may be mapped to one of the 16 constellation points.

In one aspect of the invention, each symbol of a demodulated signal may map directly to one of the 16 constellation points. However, because of noise in the propagation path, and interference from other RF sources, among other factors, a symbol may not be able to be mapped directly to a constellation point. For example, the symbol 322e may need to be mapped to a symbol. Accordingly, the mobile terminal 310 may try to map the symbol 320e to, for example, the constellation point closest to the symbol. Since the symbol 322e is the closest to the constellation point 322a, the symbol 322e may be mapped to the constellation point 322a.

With respect to FIG. 3d, since there may be 16 possibilities for mapping, the likelihood of error may be greater than if there were less than 16 constellation points. For example, QPSK modulation as illustrated with respect to FIG. 3c may comprise four constellation points. Accordingly, for a given propagation path, data transmitted using the 16 QAM modulation may have more errors than, for example, data transmitted using the QPSK modulation.

Figure 4:
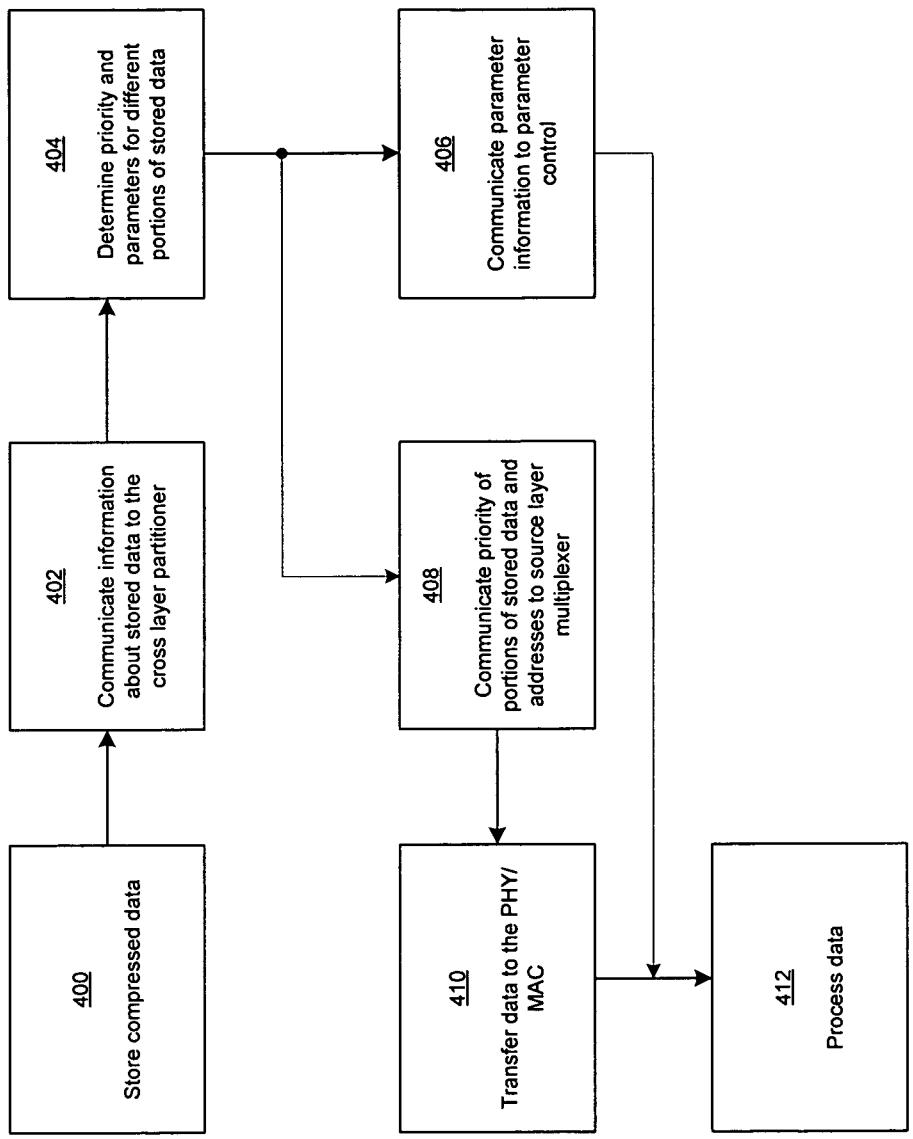
FIG. 4 is a flow chart illustrating exemplary steps for content-aware mapping/error protection, in accordance with an embodiment of the invention.

FIG. 4 is a flow chart illustrating exemplary steps for content-aware mapping/error protection, in accordance with an embodiment of the invention. Referring to FIG. 4, the exemplary steps may describe using MPEG-4 format for compression and transmitting the compressed video data. In step 400, the source encoder block 220 may compress data in MPEG-4 format and store the compressed data in the memory block 222. In step 402, the source encoder block 220 may communicate information about the compressed data to the cross layer partitioner block 228. The information may comprise, for example, the type of compression used by the source encoder block 220, and the starting and ending addresses of frames of data, and which type of frames the data might be. The frames may be, for example, I-frame, P-frame, or B-frame.

In step 404, the cross layer partitioner block 228 may assign a priority to, for example, each frame of data. The cross layer partitioner block 228 may use, for example, two different priorities—a high priority and a low priority. For example, the I-frames may be assigned a high priority, and the B-frames and P-frames may be assigned a low priority. The next steps may be steps 406 and 408.

In step 406, the cross layer partitioner block 228 may communicate, for example, parameter information to the parameter control block 230. The information may comprise, for example, the type of FEC code to be used and the type of modulation to be used by the PHY/MAC block 226 for each data input from the source layer multiplexer block 224. The next step may be step 412.

In step 408, the cross layer partitioner block 228 may communicate various information about the blocks of data in the memory block 222 to the source layer multiplexer block 224. For example, the cross layer partitioner block 228 may communicate the priority for the different blocks of data, and the start and end addresses for the various blocks of data. While start and end addresses for the various blocks of data may be used, the invention need not be so limited. For example, if the data is stored contiguously in the memory block 222, a start address and data block sizes and/or offsets may be used.

The cross layer partitioner block 228 may also indicate the path that may be used to communicate data of certain priority to the PHY/MAC block 226. For example, the high priority data may be communicated as Output1 and the low priority data as Output2. Alternatively, the high priority data may be communicated as Output2 and the low priority data as Output1. Output1 may be transmitted by the transmit antenna 232*a* and Output2 may be transmitted by the transmit antenna 232*b*.

In step 410, the source layer multiplexer block 224 may read data from the memory block 222 and multiplex the data as indicated by the information from the cross layer partitioner block 228. For example, high priority data may be output as Output1, and the low priority data may be output as Output2. This may occur because the cross layer partitioner block 228 may have determined that the transmit antenna 232*a* may have a propagation path with lower interference noise than the propagation path of the transmit antenna 232*b*. This may be determined from feedback information from a receiving device, for example, the mobile terminal 310, or from a receiver portion co-located with the transmit block 215.

In step 412, the parameter control block 230 may communicate appropriate instructions to the PHY/MAC block 226 so that a desired FEC code and a desired RF modulation scheme may be used for each of the signals Output1 and Output2 from the source layer multiplexer block 224. The RF modulated signals may then be transmitted via the appropriate transmit antennas 232*a* and 232*b*.

Another embodiment of the invention may provide a machine-readable storage, having stored thereon, a computer program having at least one code section executable by a machine, thereby causing the machine to perform the steps as described above for content-aware mapping/error protection.

In accordance with an embodiment of the invention, aspects of an exemplary system may comprise a control circuitry, for example, the cross layer partitioner block 228 and/or the parameter control block 230, which may enable controlling of a MAC layer and a PHY layer based on content of multimedia information. The PHY/MAC block 226 may comprise the MAC layer and the PHY layer. The cross layer partitioner block 228 may communicate desired configuration information, which may be based on content of multimedia information, to the parameter control block 230. The parameter control block 230 may configure the PHY/MAC block 226 based on the configuration information from the cross layer partitioner block 228. Accordingly, the PHY/MAC block 226 may operate on multimedia information before transmitting the multimedia information, which may comprise video information, audio information, and/or data.

The cross layer partitioner block 228 may determine a priority for at least a portion of the multimedia information. The cross layer partitioner block 228 may use the priority to select a FEC code to be applied to a portion of the multimedia information by the PHY/MAC block 226. The cross layer partitioner block 228 may also use the priority to select a RF modulation scheme that may be applied to a portion of the multimedia information by the PHY/MAC block 226. The cross layer partitioner block 228 may also use the priority to select at least one transmit antenna from which to transmit a portion of the multimedia information.

The cross layer partitioner block 228 may also receive feedback information from the receiving device, for example, the mobile terminal 116*a*, and/or from a receiver co-located with the transmit block 215. The feedback information may be processed by a processing circuitry, which may be, for example, the processor 210 in one embodiment of the invention. In another embodiment of the invention, the processing circuitry may comprise, for example, the cross layer partitioner block 228, the parameter control block 230, and/or the source layer multiplexer block 224. The cross layer partitioner block 228 may use the feedback information to enable selection of a FEC code to be applied to a portion of the multimedia information by the PHY/MAC block 226. The cross layer partitioner block 228 may also use the feedback information to enable selection of a RF modulation scheme to be applied to a portion of the multimedia information by the PHY/MAC block 226. The cross layer partitioner block 228 may further use the feedback information to enable selection of at least one transmit antenna from which to transmit a portion of the multimedia information.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for handling data in a communications system, the method comprising:

controlling one or both of a MAC layer and a PHY layer in a wireless communication device to wirelessly communicate a first of a plurality of portions of multimedia information based on one or more content type from a plurality of content types associated with the first of the plurality of portions of the multimedia information, and to wirelessly communicate a second of the plurality of portions of multimedia information based on one or more content types from the plurality of content types associated with the second of the plurality of portions of the multimedia information; and selecting in the wireless communication device from a plurality of multimedia types, one or more of: a forward error correction code, a radio frequency (RF) modulation scheme or at least one transmission antenna for each of the first of the plurality of portions of multimedia information and the second of the plurality of portions of multimedia information based on the associated one or more content types.

2. The method according to claim 1, wherein the multimedia information comprises one or more of the following: video information, audio information, or data.

3. The method according to claim 1 further comprising determining a priority for at least the first or second of the plurality of portions of the multimedia information for use in the controlling.

4. The method according to claim 3 further comprising selecting at least one of the at least one transmission antennas from which to transmit the at least a portion of the multimedia information based on the priority of the at least a portion of the multimedia information.

5. The method according to claim 1 further comprising determining the forward error correction code from a plurality of forward error correction codes for the plurality of multimedia types.

6. The method according to claim 1 further comprising selecting the RF modulation scheme from a plurality of RF modulation schemes for the plurality of multimedia types.

7. The method according to claim 1 further comprising processing feedback data from a communication device that receives the multimedia information transmitted by the wireless communication device for use in the controlling.

8. The method according to claim 7 further comprising selecting one or more of the: forward error correction code, RF modulation scheme or the at least one transmission antenna for the plurality of multimedia types based on the processed feedback data.

9. A non-transitory computer-readable media having stored thereon, a computer program having at least one code section for handling data in a communication system, the at least one code section being executable by a machine for causing the machine to perform steps comprising:
controlling one or both of a MAC layer and a PHY layer in a wireless communication device to wirelessly communicate a first of a plurality of portions of multimedia information based on one or more content type from a plurality of content types associated with the first of the plurality of portions of the multimedia information, and to wirelessly communicate a second of the plurality of portions of multimedia information based on one or more content type from the plurality of content types associated with the second of the plurality of portions of the multimedia information; and
selecting in the wireless communication device from a plurality of multimedia types, one or more of: a forward error correction code, a radio frequency (RF) modulation scheme or at least one transmission antenna for each of the first of the plurality of portions of multimedia information and the second of the plurality of portions of multimedia information based on the associated one or more content types.

10. The non-transitory computer-readable media according to claim 9, wherein the at least one code section comprises code that allows determination of a priority for at least a portion of the multimedia information for use in the controlling.

11. The non-transitory computer-readable media according to claim 9, wherein the at least one code section comprises code that allows selection of the one or more of: the forward error correction, the RF modulation scheme or the at least one transmission antenna for the plurality of multimedia types based on processed feedback data.

12. A system for handling data in a communication system, the system comprising:
control circuitry that enables controlling of one or both of a MAC layer and a PHY layer in a wireless communication device to wirelessly communicate a first of a plurality of portions of multimedia information based on one or more content type from a plurality of content types associated with the first of the plurality of portions of the multimedia information, and to wirelessly communicate a second of the plurality of portions of multimedia information based on one or more content type from the plurality of content types associated with the second of the plurality of portions of the multimedia information; and
the control circuitry enables selection from a plurality of multimedia types, one or more of: a forward error correction code, a radio frequency (RF) modulation scheme or at least one transmission antenna for each of the first of the plurality of portions of multimedia information and the second of the plurality of portions of multimedia information based on the associated one or more content types.

13. The system according to claim 12, wherein the multimedia information comprises one or both of the following: video information, audio information, or data.

14. The system according to claim 12, wherein the control circuitry enables determination of a priority of at least a portion of the multimedia information for use in the controlling.

15. The system according to claim 14, wherein the control circuitry enables selection of at least one antenna from which to transmit the at least a portion of the multimedia information based on the priority for the at least a portion of the multimedia information.

16. The system according to claim 12, wherein the forward error correction code is selected from a plurality of forward error correction codes for the plurality of multimedia types and is applied by one or both of the MAC layer and the PHY layer.

17. The system according to claim 12, wherein the RF modulation scheme is selected from a plurality of RF modulation schemes for the plurality of modulation types and is applied by one or both of the MAC layer and the PHY layer.

18. The system according to claim 12 further comprising processing circuitry that enables processing of feedback data from a communication device that receives the multimedia information transmitted by the wireless communication device for use in the controlling.

19. The system according to claim 18, wherein the forward error correction code is selected from a plurality of forward error correction codes for the plurality of multimedia types based on the processed feedback data and is applied by one or both of the MAC layer and the PHY layer.

20. The system according to claim 18, wherein the RF modulation scheme is selected from a plurality of RF modulation schemes for the plurality of multimedia types based on the processed feedback and is applied by one or both of the MAC layer and the PHY layer.

* * * * *